United States Patent
Mathew et al.

(10) Patent No.: US 7,737,018 B2
(45) Date of Patent: Jun. 15, 2010

(54) PROCESS OF FORMING AN ELECTRONIC DEVICE INCLUDING FORMING A GATE ELECTRODE LAYER AND FORMING A PATTERNED MASKING LAYER

(75) Inventors: Leo Mathew, Austin, TX (US); Voon-Yew Thean, Austin, TX (US); Vishal P. Trivedi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 698 days.

(21) Appl. No.: 11/671,748

(22) Filed: Feb. 6, 2007

(65) Prior Publication Data

US 2008/0188067 A1   Aug. 7, 2008

(51) Int. Cl.
*H01L 21/3205* (2006.01)
(52) U.S. Cl. .................................. 438/592; 257/E21.2
(58) Field of Classification Search ................ 438/551, 438/552, 592, 657, 923; 257/E21.2
See application file for complete search history.

(56) References Cited

U.S. PATENT DOCUMENTS

| | | | |
|---|---|---|---|
| 4,837,180 A | 6/1989 | Chao | |
| 5,102,815 A * | 4/1992 | Sanchez | 438/305 |
| 5,238,859 A | 8/1993 | Kamijo et al. | |
| 5,472,895 A | 12/1995 | Park | |
| 5,595,919 A | 1/1997 | Pan | |
| 6,743,686 B2 | 6/2004 | Lee et al. | |
| 6,797,602 B1 | 9/2004 | Kluth et al. | |
| 6,869,868 B2 * | 3/2005 | Chiu et al. | 438/592 |
| 6,972,255 B2 | 12/2005 | Reber et al. | |

OTHER PUBLICATIONS

Office Action mailed Jul. 24, 2009 in related case U.S. Appl. No. 11/671,567.
Office Action mailed Dec. 10, 2009 in related case U.S. Appl. No. 11/671,567.

* cited by examiner

*Primary Examiner*—Chandra Chaudhari

(57) ABSTRACT

A process of forming an electronic device can include forming a gate electrode layer and forming a patterned masking layer. In a first aspect, a process operation is performed before removing substantially all of a lower portion of the gate electrode layer. In a second aspect, a gate dielectric layer is formed prior to forming the gate electrode layer, and a portion of the gate dielectric layer is exposed after removing the patterned masking layer and prior to forming another masking layer. A portion of the gate electrode layer remains covered during a process where some or all of the portion would be otherwise removed or consumed. By forming the electronic device using such a process, damage to the gate electrode structure while performing subsequent processing can be significantly reduced.

20 Claims, 4 Drawing Sheets

PROCESS OF FORMING AN ELECTRONIC DEVICE INCLUDING FORMING A GATE ELECTRODE LAYER AND FORMING A PATTERNED MASKING LAYER

CROSS-REFERENCE TO RELATED APPLICATION

This application is related to co-pending U.S. patent application Ser. No. 11/671,567, entitled "Method of Forming A Semiconductor Device Having A Removable Sidewall Spacer," filed of even date herewith and assigned to the assignee hereof.

BACKGROUND

1. Field of the Disclosure

The present disclosure relates to processes of forming electronic devices, and more particularly, processes of forming the electronic devices that include forming a gate electrode layer and a patterned masking layer.

2. Description of the Related Art

The challenge of forming electronic devices continues to increase as more functionality is put into a smaller area. From a cross-sectional view, the aspect ratio of gate electrode structures continues to increase with successive generations of electronic devices. Taller, thinner structures are more fragile and therefore more likely to be damaged during subsequent processing than structures with a lower aspect ratio. Such structures are particularly problematic with respect to cleaning, stripping, and layer removal processes where additional thinning of the structures occurs.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
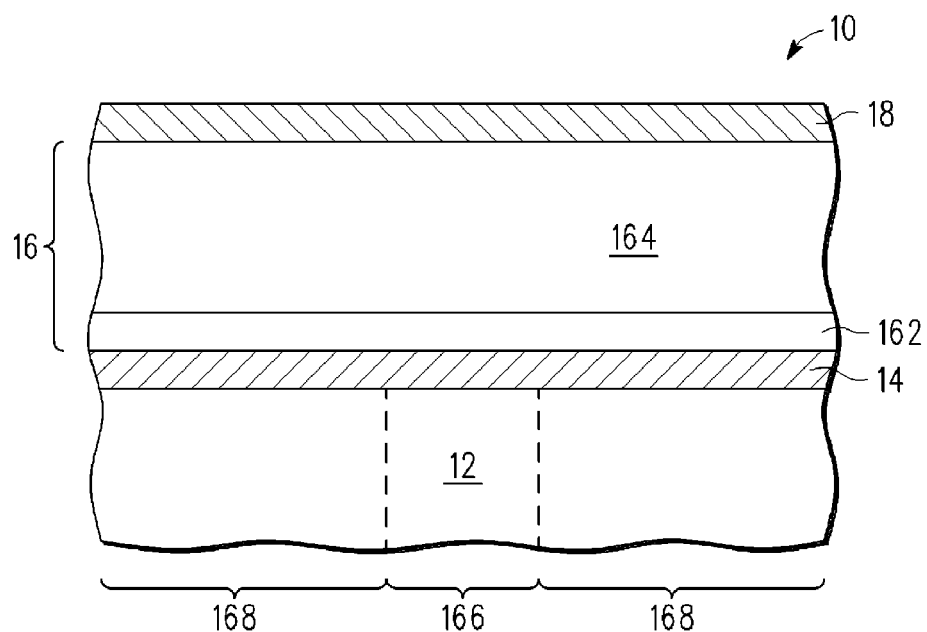
FIG. 1 includes an illustration of a cross-sectional view of a workpiece after forming a protective layer over a gate electrode layer and a substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

A process of forming an electronic device can include forming a gate electrode layer and forming a patterned masking layer over a substrate. In accordance with a specific embodiment, the patterned masking layer can overlie a first region of the substrate and an opening in the patterned masking layer can overlie a second region of the substrate. A process operation can be performed before removing substantially all of a lower portion of the gate electrode layer overlying the second region of the substrate. In an alternative embodiment, a gate dielectric layer can be formed prior to forming the gate electrode layer, and a portion of the gate dielectric layer overlying the second region of the substrate can be exposed after removing the masking layer and prior to forming another masking layer. A portion of the gate electrode layer over the first region of the substrate can remain protected during performing a process where some or all of the portion would be otherwise removed or consumed. By completing the removal of the gate electrode layer after performing the process, damage to the gate electrode structure can be controlled, and processing damage can be significantly reduced. Specific embodiments of the present disclosure will be better understood with reference to FIGS. 1 through 8.

Some terms are defined or clarified as to their intended meaning as they are used within this specification.

The term "metal" or any of its variants is intended to refer to a material that includes an element that is within any of the Groups 1 to 12, within Groups 13 to 16, an element that is along and left of a line defined by atomic numbers 13 (Al), 31 (Ga), 50 (Sn), 51 (Sb), and 84 (Po). Metal does not include Si or Ge.

The term "metal gate electrode" is intended to mean a gate electrode including a metal which substantially sets the work function for the gate electrode. A metal gate electrode may or may not include silicon, germanium, carbon, or any combination thereof. An example of a metal-containing portion of a metal gate electrode can include a metal element, a metal alloy, metal compound, (e.g., a metal nitride or a metal oxide), or any combination thereof.

The term "resolution limit" is intended to mean the smallest feature size that can be reproducibly formed when using a particular printing apparatus or other printing equipment.

The term "substrate" is intended to mean either a semiconductor base material or a base material with an overlying semiconductor layer. A semiconductor substrate can include a buried oxide layer. Examples of semiconductor substrates include bulk silicon wafers, a silicon on sapphire wafer, silicon on insulator wafers, or the like.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

FIG. 1 includes a cross-sectional view of an illustration of a portion of a workpiece 10 where an electronic device is being formed. In the illustrated embodiment, the workpiece 10 includes a substrate 12, a gate dielectric layer 14, a gate electrode layer 16, and a protective layer 18. Substrate 12 includes a semiconductor material such as silicon, germanium, carbon, another semiconductor material such as a III-V or a II-VI material, or any combination thereof. In one embodiment, the substrate 12 has either fully or partially depleted active silicon regions where n-type, p-type, or a combination of n-type and p-type channel regions can be formed. In a particular embodiment, the substrate includes a first region 166 over which a gate electrode is subsequently formed, and a second region 168, which, from a top view, lies adjacent to the subsequently formed gate electrode.

In the illustrated embodiment, the gate dielectric layer 14 includes a dielectric material such as silicon dioxide, silicon nitride, silicon oxynitride, a high dielectric constant ("high-k") material (e.g., dielectric constant greater than 8), or any combination thereof. The gate dielectric layer 14 is deposited or grown over the surface of the substrate 12 using a conventional or proprietary chemical vapor deposition ("CVD") technique, physical vapor deposition ("PVD") technique, atomic layer deposition ("ALD") technique, thermal oxidation, thermal nitridation, or any combination thereof. The gate dielectric 14 has a thickness in a range of approximately 1 to approximately 25 nm.

As illustrated, the gate electrode layer 16 includes a lower electrode layer 162 and an upper electrode layer 164. The lower electrode layer 162 lies adjacent to the gate dielectric layer 14 and substantially sets the work function of a subsequently formed gate electrode. In one embodiment, the lower electrode layer 162 includes a metal-containing material, such as a conductive metal-oxide, conductive metal nitride, a conductive metal-semiconductor material, or any combination thereof. In another embodiment, the material of the lower electrode layer 162 includes platinum, palladium, iridium, molybdenum, osmium, ruthenium, rhenium, tantalum, titanium, indium-tin, indium-zinc, aluminum-tin, or any combination thereof. In a particular embodiment, the lower electrode layer 162 includes TaC, TiN, Mo$_2$N, or any combination thereof. In still another embodiment, the lower electrode layer 162 includes a material that dissolves in an acidic or a peroxide solution. The lower electrode layer 162 is deposited using a conventional or proprietary CVD process, PVD process, ALD process, or any combination thereof. The lower electrode layer 162 has a thickness of at least approximately 3 nm, and in one embodiment, has a thickness in a range of approximately 5 to approximately 15 nm.

The upper electrode layer 164 overlies the lower electrode layer 162 and serves to increase the current carrying capacity of a gate electrode subsequently formed from the gate electrode layer 16. The upper electrode layer 164 includes a conductive material typically used in forming gate electrodes. In one embodiment, the upper electrode layer 164 principally includes a semiconductor material, such as silicon, germanium, carbon, or any combination thereof. The upper electrode layer 164 can also include an impurity such as a dopant, if needed or desired. Alternatively, the upper electrode layer 164 can be substantially undoped as deposited. The upper electrode layer 164 can be formed by a process previously described for forming the lower electrode layer 162. In one embodiment, the upper electrode layer 164 has a thickness in a range of approximately 30 to approximately 90 nm.

The protective layer 18 overlies the upper electrode layer 164 and serves to protect the surface of the gate electrode layer 16 during subsequent processing. In the illustrated embodiment, the protective layer 18 includes a protective portion and an upper portion. The protective portion lies between the upper portion and the surface of the gate electrode layer 16. In one embodiment the protective portion also serves as a hard mask during an etch process performed after the upper portion has been removed. In another embodiment, the upper portion serves as a barrier to against unwanted reaction at the surface of the upper electrode layer 164, at the protective portion, or any combination thereof. The protective layer 18 includes an oxide, a nitride, an oxynitride, or any combination thereof. The protective layer 18 is deposited using a process previously described with respect to the lower electrode layer 162, a thermal growth process, or any combination thereof. In one embodiment, the protective portion and the upper portion include different materials that can be removed selectively with respect to each other. In one embodiment, the protective portion is a thermally grown oxide layer, and the upper portion is a deposited nitride layer. The protective layer 18 has a thickness in a range of approximately 5 to approximately 50 nm.

Figure 2:
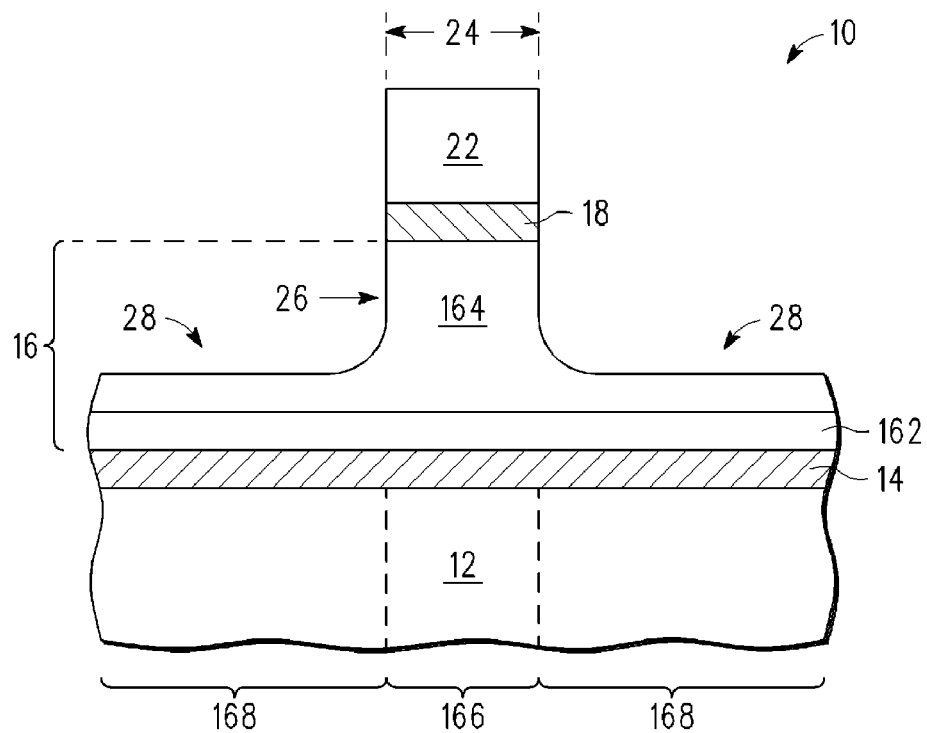
FIG. 2 includes an illustration of a cross-sectional view of the workpiece of FIG. 1 after forming a patterned masking layer and removing an upper portion of the gate electrode layer.

FIG. 2 includes an illustration of a cross-sectional view of the workpiece 10 after forming a patterned masking layer 22 and removing an upper portion of the gate electrode layer 16 overlying the second region 168. A patterned masking layer 22 is formed over the gate electrode layer 16 and includes a masking member overlying the first region 166 of the substrate 12 and an opening formed over the second region 168 of the substrate 12. The patterned masking layer 22 includes an organic material, or other material that is removed in an oxidizing or acidic environment, and in one embodiment, is formed using a conventional or proprietary photolithographic process. In a particular embodiment, the masking member of the patterned masking layer 22 is formed with a first dimension 24, substantially at the resolution limit of the masking process.

In the embodiment illustrated in FIG. 2, an exposed portion of the protective layer 18 and the upper portion of the gate electrode layer 16 overlying the second region 168 of the substrate 12 are removed forming an electrode portion 26 of the gate electrode layer 16 over the first region 166 and a lower portion 28 of the gate electrode layer 16 over the second region 168. The electrode portion 26 lies between the masking member and the first region 166 of the substrate 12, and the lower portion 28 lies between the opening and the second region 168 of the substrate 12. The lower portion 28 has a thickness greater than the lower electrode layer 162, and therefore, the lower electrode layer 162 and the gate dielectric layer 14 are not exposed. Also, in one embodiment, from a cross-sectional view, the lower portion 28 includes a curved taper immediately adjacent to the electrode portion 26. In one embodiment, the upper portion of the gate electrode layer 16 is removed using a conventional or proprietary etch process. In a particular embodiment, the upper portion of the gate electrode layer 16 is removed using a timed etch.

After removing the upper portion of the gate electrode layer 16, the electrode portion 26 has a dimension substantially the same as the dimension 24 of the patterned masking layer 22. By forming such a structure, the lower portion 28 can serve to laterally support the electrode portion 26, and the electrode portion 26 extends to a height less than a height of the subsequently formed gate electrode during a subsequent process. In a particular embodiment, the gate electrode layer 16 has an initial roughness after removing the upper portion of the gate electrode layer 16 that is undesirably large such that the final product yield is improved if the initial roughness is reduced during subsequent processing.

Figure 3:
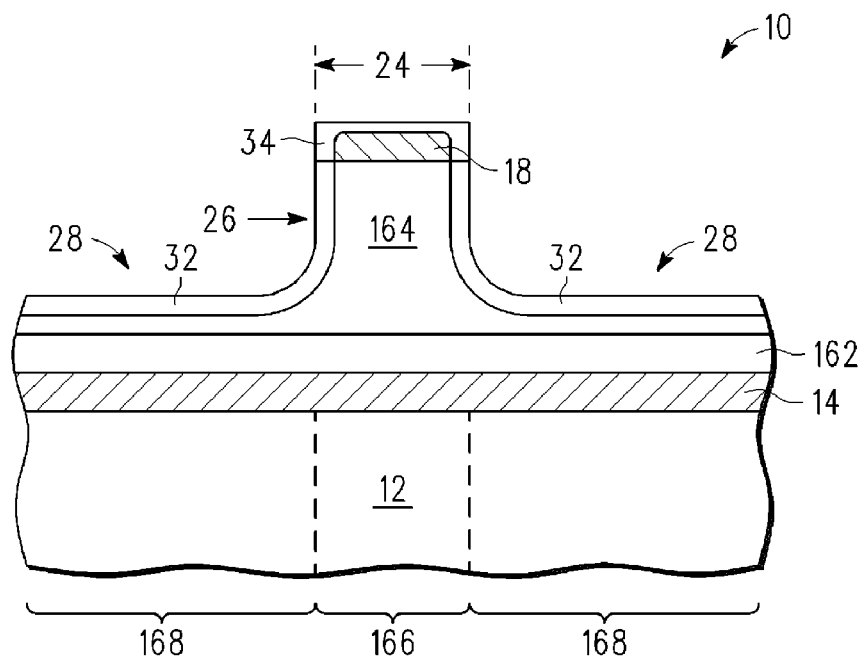
FIG. 3 includes an illustration of a cross-sectional view of the workpiece of FIG. 2 after forming a surface layer.

FIG. 3 includes an illustration of a cross-sectional view of the workpiece 10 of FIG. 2 after removing the patterned masking layer 22, and forming a surface layer 32. The patterned masking layer 22 is removed using a conventional or proprietary process. In one embodiment, the patterned masking layer 22 is removed by exposure to an oxidizing environment, such as a peroxide dip or an oxygen plasma.

The surface layer 32 is formed from exposed portions of the gate electrode layer 16. The surface layer 32 acts as a sacrificial layer to reduce a surface roughness or adjust an overall dimension of the gate electrode layer 16, acts as a screen layer to prevent implant channeling during a subsequently performed implant process, or any combination thereof. The surface layer 32 includes an insulating material, and in the illustrated embodiment, the surface layer 32 includes an oxide, a nitride, an oxynitride, or any combination thereof. During the formation process, a surface of the gate electrode layer 16 is exposed to a conventional or proprietary oxidizing or nitridizing process, and a portion is of the gate electrode layer 16 reacts to grow the surface layer 32. In a particular embodiment, the process is an oxidizing process and includes exposing the upper electrode layer 164 to steam. In another particular embodiment, the amount of oxidation is controlled as to target a particular remaining thickness, width, or any combination thereof of the gate electrode layer 16 during the process. The surface layer 32 has a thickness in a range of approximate 2 to approximately 15 nm.

Figure 4:
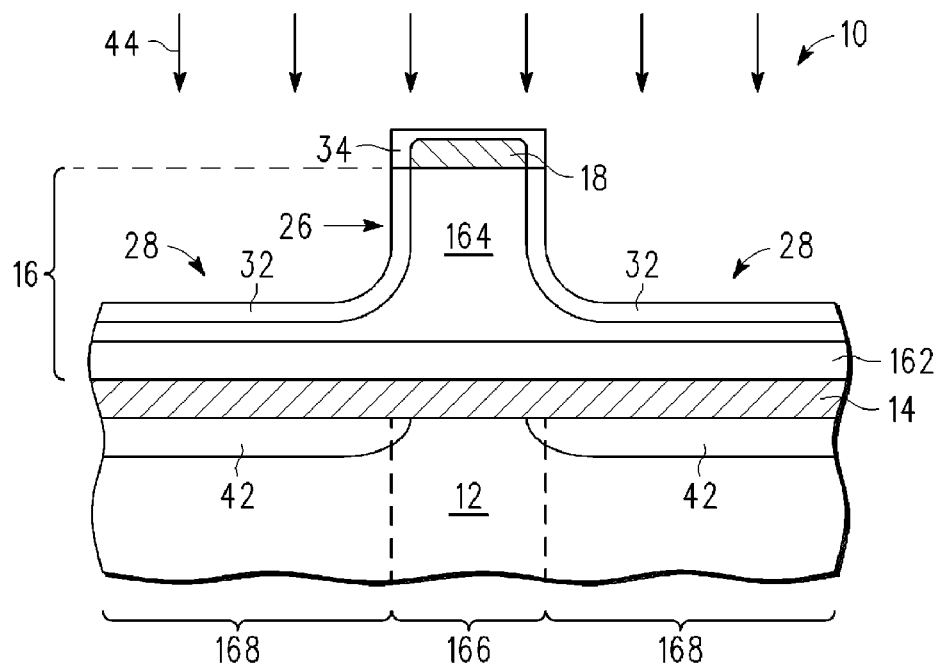
FIG. 4 includes an illustration of a cross-sectional view of the workpiece of FIG. 3 while introducing a dopant into portions of the substrate.

FIG. 4 includes an illustration of a cross-sectional view of the workpiece 10 of FIG. 3 during formation of doped regions 42 within the substrate. The doped regions 42 can act as source regions, drain regions, source/drain regions, or any combination thereof. The doped regions 42 include an n-type dopant, a p-type dopant, or any combination thereof. In the illustrated embodiment, an implant energy is adjusted to account for the thickness of material to be penetrated, and a dopant is introduced into the substrate 12 through the lower portion 28 of the gate electrode layer 16. In a particular embodiment, the curved taper portion of the lower portion 28 blocks relatively more of the implant dose than the rest of the lower portion 28. In this embodiment, the doped regions 42 are more lightly doped where the implant passed through the curved taper portion of the lower portion 28 and more heavily doped elsewhere within the second region 168 of the substrate 12. Thus, the source drain implant and the extension implant can be performed at substantially the same time.

Although illustrated with the direction of the implantation substantially perpendicular to a surface the workpiece 10 in FIG. 4, other implant angles can be used. In one embodiment, the implantation angle is changed such that more dopant is implanted into substrate 12 under the electrode portion 26 of the gate electrode layer 16. In another embodiment, the electrode portion 26 is doped by the implantation through a wall of the electrode portion 26.

Figure 5:
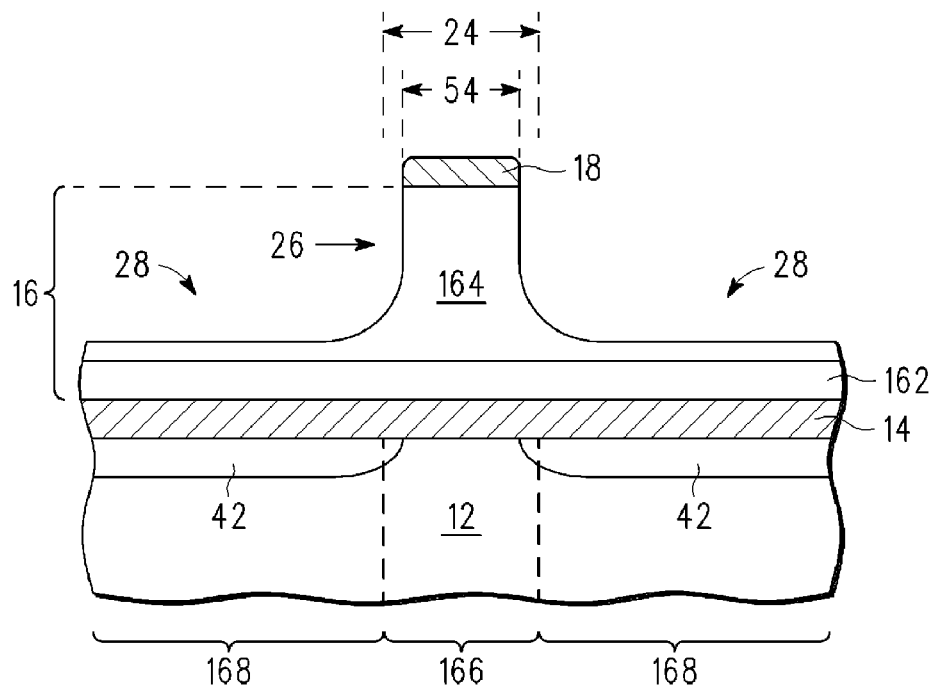
FIG. 5 includes an illustration of a cross-sectional view of the workpiece of FIG. 4 after removing the surface layer.

FIG. 5 includes an illustration of a cross-sectional view of the workpiece 10 of FIG. 4 after removing substantially all of the surface layer 32. In one embodiment, after removing the surface layer 32, the electrode portion 26 has a second dimension 54 that is less than the first dimension 24. In a more particular embodiment the second dimension 54 is less than the resolution limit of the masking process used to form the masking layer 22. In one embodiment, during the removal process, the upper portion is undercut such that the remaining portion of the protective portion has a dimension approximately the same as a corresponding dimension of the gate electrode portion 26, rather than the dimension 24. In a particular embodiment, the dimension of the protective portion is substantially equal to approximately the dimension 54. After removal of the surface layer 32, the exposed surface of the gate electrode layer 16 has a final roughness less than the initial roughness. In the illustrated embodiment the surface layer 32 is removed using a conventional or proprietary etch process. In one embodiment a wet etch process, including exposing the workpiece 10 to an acid, is used to remove the surface layer 32.

Figure 6:
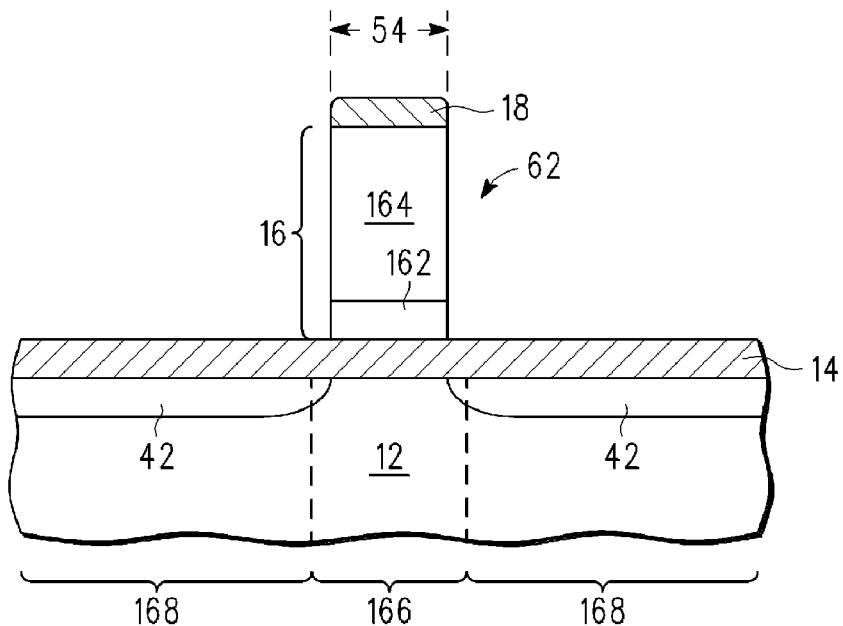
FIG. 6 includes an illustration of a cross-sectional view of the workpiece of FIG. 5 after removing substantially all of a lower portion of the gate electrode layer overlying a portion of the substrate.

FIG. 6 includes an illustration of a cross-sectional view of the workpiece 10 of FIG. 5 after removing the upper portion of the protective layer 18 and the lower portion 28 of the gate electrode layer 16 from over the second region 168. In the illustrated embodiment, the upper portion is removed selectively to the protective portion such that the protective portion remains after completing the removal process. The protective portion then acts as a hard mask having approximately the dimension 54. The removal of the lower portion 28 is then performed using a conventional or proprietary anisotropic etch process. During the etch process, substantially all of the lower portion 28 of gate electrode layer 16 is removed. More particularly, after removing the upper electrode layer 164 within the lower portion 28, the lower electrode layer 162 is exposed and removed from over the second region 168 of the substrate 12. The gate dielectric layer 14 is exposed prior to forming another patterned masking layer. In one embodiment, the removal process is an etch with a selectivity such that the protective portion, and the gate dielectric layer 14 act as etch stop layers for the removal process. In a particular embodiment, the gate electrode 62 formed from the gate electrode layer 16 has a width with substantially the same value as the dimension 54.

Figure 7:
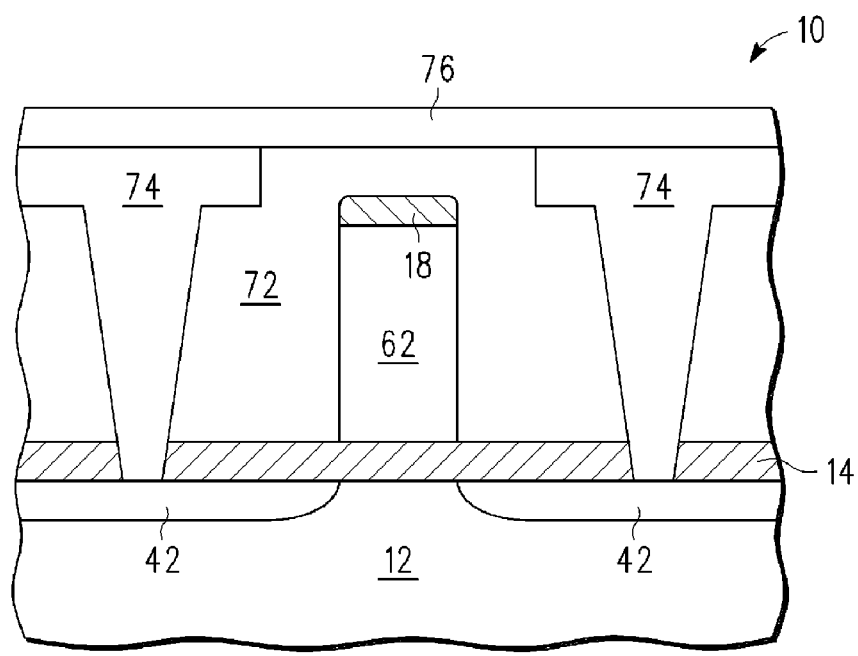
FIG. 7 includes an illustration of a cross-sectional view of a substantially complete electronic device.

FIG. 7 includes an illustration of a cross-sectional view of a substantially completed electronic device. An insulating layer 72, interconnects 74, and an encapsulating layer 76 are formed using one or more conventional or proprietary techniques. In the illustrated embodiment, interconnects 74 electrically connect to the doped regions 42. In another embodiment, a plurality of insulating layers, interconnects, encapsulating layers, or any combination thereof are used to form the substantially complete electronic device.

Figure 8:
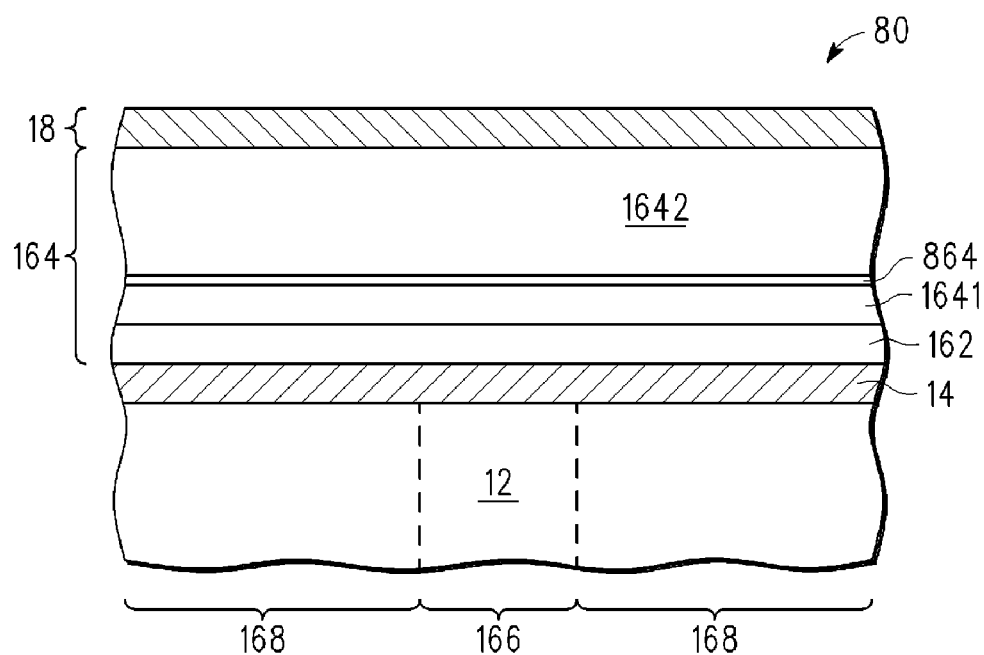
FIG. 8 includes an illustration of a cross-sectional view of another workpiece according to an alternative embodiment, after forming a protective layer over a gate electrode layer and a substrate.

In an alternative embodiment, ending the initial etch of the gate electrode layer 16 using an end-point signal rather than using a timed etch process may be advantageous. FIG. 8 includes an illustration of a cross-sectional view of a workpiece 80 according to an alternative embodiment. Processing proceeds as previously described for the workpiece 10 of FIG. 1 except that an end-point marker 864 is formed within the upper electrode layer 164 of the workpiece 80. In the illustrated embodiment, during the formation of the upper electrode layer 164, a dopant material is introduced, resulting in the upper electrode layer 164 including the end-point marker 864 lying between a first portion 1641 and a second portion 1642 of the upper electrode layer 164. As illustrated, the end-point marker 864 includes the dopant material while the first portion 1641 and the second portion 1642 contain substantially no dopant material.

Processing proceeds as previously described with respect to the workpiece 10 with the formation of the patterned masking layer 22 over the workpiece 80. During the subsequent etch process using an embodiment described with respect to FIG. 2, when the end-point marker 864 is exposed during etching the exposed portion of the gate electrode layer 16, the end-point marker 864 is detected. A control signal is generated in response to the end-point marker 864 being detected, and the etching process ends in response to the control signal. In a particular embodiment, the etching process ends within the first portion 1641 of the upper electrode layer 164 prior to exposing the lower electrode layer 162 or the gate dielectric layer 14. Processing of the workpiece 80 then proceeds as previously described with respect to the workpiece 10 to form another substantially complete electronic device. In a particular embodiment, the dopant of the end-point marker layer 864 is selected as an n-type dopant if the electrode portion 26 is to be subsequently doped with an n-type dopant, or a p-type-dopant if the electrode portion 26 is subsequently doped with a p-type dopant.

In accordance with the embodiments disclosed herein, an intervening process operation is performed when removing a portion of the gate electrode layer 16 to form the gate electrode 62. By performing the intervening process operation on the partially formed electrode portion 26 before removing the lower portion 28, the benefit of performing the process can be accomplished without exposing the lower electrode layer 162 or the gate dielectric layer 14 to the conditions of the intervening process operation.

In one aspect, the intervening process operation is removing the patterned masking layer 22. Pattern masking removal can include exposing the workpiece surface to a strongly oxidizing environment that can negatively affect the lower electrode layer 162, the gate dielectric layer 14, or any combination thereof. In another aspect, the intervening process operation includes performing an ion implantation. With the lower portion 28 in place, the ion implantation is performed on the electrode portion 26 that protrudes less and is therefore more physically robust than the gate electrode 62. In still another aspect, the intervening process is reacting a surface to form a surface layer. In one embodiment, the surface layer is a sacrificial layer that can reduce the roughness of an exposed surface, adjust the final dimension of a gate electrode or any combination thereof. Substantially protecting the lower electrode layer 162, the gate dielectric layer 14, or any combination thereof during the sacrificial layer formation reduces the damage from exposure during such processes. In one embodiment, removing the surface layer is also performed prior to exposing the lower electrode layer 162, the gate dielectric layer 14, or any combination thereof.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include forming a gate electrode layer over a substrate. Forming the gate electrode layer can include forming a first electrode layer over the substrate and having a first composition and a first thickness, and forming a second electrode layer after forming the first electrode layer and having a second composition different from the first composition and having a second thickness greater than the first thickness. The process can also include forming a patterned masking layer including a masking member and an opening, wherein the masking member overlies a first region of the substrate, and the opening overlies a second region of the substrate. The process can further include removing an upper portion of the gate electrode layer to form a lower portion of the gate electrode layer overlying the second region of the substrate that includes the first electrode layer and a remaining portion of the second electrode layer. The lower portion of the gate electrode layer can have a third thickness greater than the first thickness. The process can still further include performing a process operation other than removing substantially all of the lower portion of the gate electrode layer. The process can also include removing substantially all of the lower portion of the gate electrode layer overlying the second region of the substrate to form a gate electrode overlying the first region of the substrate, wherein removing substantially all of the lower portion of the gate electrode layer is performed after performing the process operation.

In one embodiment of the first aspect, the first electrode layer can include a metal-containing material, and the second electrode layer can include a semiconductor material. In another embodiment, the first electrode layer can set the work function of the subsequently formed gate electrode. In still another embodiment, performing the process operation can include forming another layer, removing another layer, introducing a dopant, or any combination thereof.

In another embodiment of the first aspect, forming the patterned masking layer is performed using a lithographic process capable of printing a feature at a resolution limit. Also, the masking member has a width as least as wide as the resolution limit, and the gate electrode corresponding with the masking member has a width less than the resolution limit. In a particular embodiment, performing the process operation can include ion implanting through the remaining portion of the second electrode layer. In a more particular embodiment, ion implanting through the remaining portion includes performing a source/drain implant and an extension implant at substantially a same time.

In another particular embodiment of the first aspect, performing the process operation can include reacting a surface of the second electrode layer to form a surface layer, and removing the surface layer. In a more particular embodiment, reacting the surface of the second electrode layer includes forming an oxide, forming a nitride, forming an oxynitride, or any combination thereof. In another more particular embodiment, reacting the surface of the second electrode layer can include exposing the second electrode layer to steam. In still another more particular embodiment, after removing the upper portion of the gate electrode layer, the gate electrode layer can include an electrode portion overlying the first region of the substrate, wherein the electrode portion includes a wall having a first roughness prior to reacting the surface of the second electrode layer and a second roughness after removing the surface layer, and the second roughness is less than the first roughness.

In a second aspect, a process of forming an electronic device can include forming a gate dielectric layer over a substrate, forming a gate electrode layer over the gate dielectric layer, and forming a patterned masking layer, wherein an exposed portion of the gate electrode layer lies within an opening in the patterned masking layer. The process can also include etching the exposed portion of the gate electrode layer, removing the patterned masking layer after etching the exposed portion of the gate electrode layer and before exposing the gate dielectric layer. The process can further include exposing a portion of the gate dielectric layer before forming another patterned masking layer.

In a particular embodiment of the second aspect, forming the gate electrode layer further includes forming a metal-containing electrode layer on the gate dielectric layer, and the process further includes exposing a portion of the metal-containing electrode layer after removing the patterned masking layer and prior to exposing the portion of the gate dielectric layer. In a more particular embodiment, removing the patterned masking layer includes removing a hard mask layer, removing an anti-reflective coating layer, removing a resist layer, or any combination thereof. In another particular embodiment, forming the gate dielectric layer includes forming the gate dielectric layer having a dielectric constant greater than 8.0.

In still another particular embodiment of the second aspect, forming the gate electrode layer can include forming a semiconductor layer over the metal-containing layer, wherein the semiconductor layer includes an end-point marker. Also etching the exposed portion of the gate electrode layer can include exposing the end-point marker, detecting the exposed end-point marker, generating a control signal in response to detecting the exposed end-point marker, and ending etching the exposed portion of the gate electrode layer in response to the control signal. In yet another particular embodiment, etching the exposed portion of the gate electrode layer is performed using a timed etch process.

In a third aspect, a process of forming an electronic device can include forming a gate dielectric layer over a substrate and forming a metal-containing layer on the gate dielectric layer, wherein the metal-containing layer has a first thickness. The process can also include forming a semiconductor layer over the substrate after forming the metal-containing layer, wherein the semiconductor layer has a second thickness greater than the first thickness. The process can further include forming a patterned masking layer including a masking member and an opening, wherein the masking member overlies a first region of the substrate, and the opening overlies a second region of the substrate, and an exposed portion of the semiconductor layer lies between the opening and the substrate. The process can still further include removing most of the exposed portion of the semiconductor layer to form a remaining portion of the semiconductor layer overlying the second region of the substrate, wherein substantially all of the metal-containing layer remains covered by the semiconductor layer. The process can yet further include removing the patterned masking layer and oxidizing the remaining portion of the semiconductor layer to form a surface layer, wherein oxidizing the semiconductor layer can be performed using steam. The process can also include introducing a dopant through the metal-containing layer and into the substrate and removing the surface layer. The process can further include removing remaining portions of the semiconductor layer and the metal-containing layer overlying the second region of the substrate to form a gate electrode over the first region of the substrate, wherein the gate electrode includes the metal-containing layer and the semiconductor layer.

In one embodiment of the third aspect, removing most of the exposed portion of the semiconductor layer can be performed such that the remaining portion of the semiconductor layer has, from a cross-sectional view, a curved taper. Also, introducing the dopant can be performed such that an extension region and a source/drain region is formed within the second region of the substrate, wherein the extension region is covered by the curved taper of the semiconductor layer, and a source/drain region lies away from the curved taper. In another embodiment, after removing most of the exposed portion of the semiconductor layer, the semiconductor layer can include a wall having a first roughness, and after removing the surface layer, the wall has a second roughness less than the first roughness.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
    forming a gate electrode layer over a substrate, wherein forming the gate electrode layer includes:
        forming a first electrode layer over the substrate and having a first composition and a first thickness; and
        forming a second electrode layer after forming the first electrode layer and having a second composition different from the first composition and having a second thickness greater than the first thickness;
    forming a patterned masking layer including a masking member and an opening, wherein:
        the masking member overlies a first region of the substrate; and
        the opening overlies a second region of the substrate;
    removing an upper portion of the gate electrode layer to form a lower portion of the gate electrode layer overlying the second region of the substrate that includes the first electrode layer and a remaining portion of the second electrode layer, wherein the lower portion of the gate electrode layer has a third thickness greater than the first thickness;
    performing a process operation other than removing substantially all of the lower portion of the gate electrode layer; and
    removing substantially all of the lower portion of the gate electrode layer overlying the second region of the substrate to form a gate electrode overlying the first region of the substrate, wherein removing substantially all of the lower portion of the gate electrode layer is performed after performing the process operation.

2. The process of claim 1, wherein:
the first electrode layer includes a metal-containing material; and
the second electrode layer includes a semiconductor material.

3. The process of claim 2, wherein the first electrode layer sets the work function of the subsequently formed gate electrode.

4. The process of claim 2, wherein performing the process operation includes forming another layer, removing another layer, introducing a dopant, or any combination thereof.

5. The process of claim 2, wherein forming the patterned masking layer is performed using a lithographic process capable of printing a feature at a resolution limit, wherein:
the masking member has a width as least as wide as the resolution limit; and
the gate electrode corresponding with the masking member has a width less than the resolution limit.

6. The process of claim 2, wherein performing the process operation includes ion implanting through the remaining portion of the second electrode layer.

7. The process of claim 6, wherein ion implanting through the remaining portion includes performing a source/drain implant and an extension implant at substantially a same time.

8. The process of claim 1, wherein performing the process operation includes:
reacting a surface of the second electrode layer to form a surface layer; and
removing the surface layer.

9. The process of claim 8, wherein reacting the surface of the second electrode layer includes forming an oxide, forming a nitride, forming an oxynitride, or any combination thereof.

10. The process of claim 8, wherein reacting the surface of the second electrode layer includes exposing the second electrode layer to steam.

11. The process of claim 8, wherein after removing the upper portion of the gate electrode layer, the gate electrode layer includes an electrode portion overlying the first region of the substrate, wherein the electrode portion includes a wall having a first roughness prior to reacting the surface of the second electrode layer and a second roughness after removing the surface layer, and the second roughness is less than the first roughness.

12. A process of forming an electronic device comprising:
forming a gate dielectric layer over a substrate;
forming a gate electrode layer over the gate dielectric layer, wherein forming the gate electrode layer comprises:
forming a metal-containing electrode layer on the gate dielectric layer; and
forming a semiconductor layer over the metal-containing layer, wherein the semiconductor layer includes an end-point marker;
forming a patterned masking layer, wherein an exposed portion of the gate electrode layer lies within an opening in the patterned masking layer;
etching the exposed portion of the gate electrode layer, wherein etching the exposed portion of the gate electrode layer includes:
exposing the end-point marker;
detecting the exposed end-point marker;
generating a control signal in response to detecting the exposed end-point marker; and
ending etching the exposed portion of the gate electrode layer in response to the control signal;
removing the patterned masking layer after etching the exposed portion of the gate electrode layer and before exposing the gate dielectric layer; and
exposing a portion of the metal-containing electrode layer after removing the patterned masking layer;
exposing a portion of the gate dielectric layer before forming another patterned masking layer, wherein exposing the portion of the gate dielectric layer is performed after exposing the portion of the metal-containing electrode layer.

13. The process of claim 12, wherein removing the patterned masking layer includes removing a hard mask layer, removing an anti-reflective coating layer, removing a resist layer, or any combination thereof.

14. The process of claim 12, wherein forming the gate dielectric layer includes forming the gate dielectric layer having a dielectric constant greater than 8.0.

15. The process of claim 12, wherein etching the exposed portion of the gate electrode layer is performed using a timed etch process.

16. A process of forming an electronic device comprising:
forming a gate dielectric layer over a substrate;
forming a metal-containing layer on the gate dielectric layer, wherein the metal-containing layer has a first thickness;
forming a semiconductor layer over the substrate after forming the metal-containing layer, wherein the semiconductor layer has a second thickness greater than the first thickness;
forming a patterned masking layer including a masking member and an opening, wherein:
the masking member overlies a first region of the substrate; and
the opening overlies a second region of the substrate, and an exposed portion of the semiconductor layer lies between the opening and the substrate;
removing most of the exposed portion of the semiconductor layer to form a remaining portion of the semiconductor layer overlying the second region of the substrate, wherein substantially all of the metal-containing layer remains covered by the semiconductor layer;
removing the patterned masking layer;
oxidizing the remaining portion of the semiconductor layer to form a surface layer, wherein oxidizing the semiconductor layer is performed using steam;
introducing a dopant through the metal-containing layer and into the substrate;
removing the surface layer; and
removing remaining portions of the semiconductor layer and the metal-containing layer overlying the second region of the substrate to form a gate electrode over the first region of the substrate, wherein the gate electrode includes the metal-containing layer and the semiconductor layer.

17. The process of claim 16, wherein:
removing most of the exposed portion of the semiconductor layer is performed such that the remaining portion of the semiconductor layer has, from a cross-sectional view, a curved taper; and
introducing the dopant is performed such that an extension region and a source/drain region is formed within the second region of the substrate, wherein the extension region is covered by the curved taper of the semiconductor layer, and a source/drain region lies away from the curved taper.

18. The process of claim 16, wherein:
after removing most of the exposed portion of the semiconductor layer, the semiconductor layer includes a wall having a first roughness; and
after removing the surface layer, the wall has a second roughness less than the first roughness.

19. The process of claim 16, wherein the metal-containing layer includes platinum, palladium, iridium, molybdenum, osmium, ruthenium, rhenium, tantalum, titanium or any combination thereof.

20. The process of claim 16, wherein the metal-containing layer includes a material that dissolves in an acidic or a peroxide solution.

* * * * *